US011674239B2

(12) United States Patent
Hoshikawa et al.

(10) Patent No.: US 11,674,239 B2
(45) Date of Patent: Jun. 13, 2023

(54) GALLIUM OXIDE CRYSTAL MANUFACTURING DEVICE

(71) Applicants: Fujikoshi Machinery Corp., Nagano (JP); SHINSHU UNIVERSITY, Nagano (JP); Novel Crystal Technology, Inc., Saitama (JP)

(72) Inventors: Keigo Hoshikawa, Nagano (JP); Takumi Kobayashi, Nagano (JP); Yoshio Otsuka, Nagano (JP); Toshinori Taishi, Nagano (JP)

(73) Assignees: Fujikoshi Machinery Corp., Nagano (JP); Shinshu University, Nagano (JP); Novel Crystal Technology, Inc., Saitama (JP)

( * ) Notice: Subject to any disclaimer, the term of this patent is extended or adjusted under 35 U.S.C. 154(b) by 145 days.

(21) Appl. No.: 17/183,753

(22) Filed: Feb. 24, 2021

(65) Prior Publication Data

US 2021/0269941 A1  Sep. 2, 2021

(30) Foreign Application Priority Data

Feb. 27, 2020  (JP) ............................. JP2020-032482

(51) Int. Cl.
*C30B 35/00* (2006.01)
*C30B 11/00* (2006.01)

(52) U.S. Cl.
CPC .......... *C30B 35/002* (2013.01); *C30B 11/002* (2013.01); *C30B 11/003* (2013.01); *C30B 11/006* (2013.01)

(58) Field of Classification Search
CPC ... C30B 11/002; C30B 11/003; C30B 11/006; C30B 29/16; C30B 35/002
See application file for complete search history.

(56) References Cited

U.S. PATENT DOCUMENTS

| 10,570,528 B2 | 2/2020 | Hoshikawa et al. |
| 2009/0194732 A1* | 8/2009 | Luo ........................ C30B 29/22 117/73 |
| 2017/0306521 A1* | 10/2017 | Hoshikawa ....... H01L 21/02565 |

FOREIGN PATENT DOCUMENTS

JP  2017-193466 A  10/2017

* cited by examiner

*Primary Examiner* — Matthew J Song
(74) *Attorney, Agent, or Firm* — Scully, Scott, Murphy & Presser, PC

(57) ABSTRACT

A gallium oxide crystal manufacturing device includes a crucible to hold a gallium oxide source material therein, a crucible support that supports the crucible from below, a crucible support shaft that is connected to the crucible support from below and vertically movably supports the crucible and the crucible support, a tubular furnace core tube that surrounds the crucible, the crucible support and the crucible support shaft, a tubular furnace inner tube that surrounds the furnace core tube, and a resistive heating element including a heat-generating portion placed in a space between the furnace core tube and the furnace inner tube. Melting points of the furnace core tube and the furnace inner tube are not less than 1900° C. A thermal conductivity of a portion of the furnace core tube located directly next to the crucible in a radial direction thereof is higher than a thermal conductivity of the furnace inner tube.

6 Claims, 13 Drawing Sheets

GALLIUM OXIDE CRYSTAL MANUFACTURING DEVICE

CROSS-REFERENCE TO RELATED APPLICATIONS

The present patent application claims the priority of Japanese patent application No. 2020/032482 filed on Feb. 27, 2020, and the entire contents of Japanese patent application No. 2020/032482 are hereby incorporated by reference.

TECHNICAL FIELD

The present invention relates to a gallium oxide crystal manufacturing device.

BACKGROUND ART

A gallium oxide crystal manufacturing device for growing crystal using the vertical Bridgman method is known (see Patent Literature 1). In the gallium oxide crystal manufacturing device described in Patent Literature 1, a crucible is heated by a resistive heating element to melt a gallium oxide source material held in the crucible.

According to Patent Literature 1, a β-$Ga_2O_3$ crystal with a diameter of 2 inches was successfully obtained by using a crucible with an inner diameter of 2 inches even though it was not a perfect single crystal.

CITATION LIST

Patent Literature

Patent Literature 1: JP 2017/193466 A

SUMMARY OF INVENTION

To grow a good-quality single crystal by the vertical Bridgman method, temperature distribution suitable for crystal growth needs to be produced around the crucible, and the temperature distribution conditions to be satisfied are stricter when the size of a crystal to be grown is larger.

To produce an intended temperature distribution, the device needs to be configured to appropriately control a flow of heat around the crucible. Therefore, with the manufacturing device described in Patent Literature 1, it is considered to be difficult to obtain a gallium oxide single crystal with a size of 2 inches or larger due to its structure.

It is an object of the invention to provide a gallium oxide crystal manufacturing device that is configured to obtain a gallium oxide single crystal having a large size and including little crystal defects to cause a degradation in crystalline quality in the crystal growth by the vertical Bridgman method.

According to an embodiment of the invention, a gallium oxide crystal manufacturing device defined in [1] to [7] below can be provided.

[1] A gallium oxide crystal manufacturing device, comprising:
  a crucible to hold a gallium oxide source material therein;
  a crucible support that supports the crucible from below;
  a crucible support shaft that is connected to the crucible support from below and vertically movably supports the crucible and the crucible support;
  a tubular furnace core tube that surrounds the crucible, the crucible support and the crucible support shaft;
  a tubular furnace inner tube that surrounds the furnace core tube; and
  a resistive heating element comprising a heat-generating portion placed in a space between the furnace core tube and the furnace inner tube,
  wherein melting points of the furnace core tube and the furnace inner tube are not less than 1900° C., and
  wherein a thermal conductivity of a portion of the furnace core tube located directly next to the crucible in a radial direction of the furnace core tube is higher than a thermal conductivity of the furnace inner tube.

[2] The gallium oxide crystal manufacturing device according to [1] set forth above, wherein the furnace core tube comprises a first portion including the portion located directly next to the crucible in the radial direction of the furnace core tube and a second portion other than the first portion, and a thermal conductivity of the first portion is higher than a thermal conductivity of the second portion.

[3] The gallium oxide crystal manufacturing device according to [1] or [2] set forth above, comprising:
  a plate-shaped member that covers an opening at an upper end of the furnace core tube; and
  a heat-retention material placed on the plate-shaped member.

[4] The gallium oxide crystal manufacturing device according to any one of [1] to [3] set forth above, wherein the portion of the furnace core tube located directly next to the crucible in the radial direction of the furnace core tube comprises an alumina-based ceramic or a magnesia-based ceramic, and the furnace inner tube comprises a zirconia-based ceramic.

[5] The gallium oxide crystal manufacturing device according to any one of [1] to [4] set forth above, wherein the crucible comprises a platinum-based alloy.

[6] The gallium oxide crystal manufacturing device according to [5] set forth above, wherein the crucible support comprises a first block as the uppermost portion comprising a zirconia-based ceramic and directly in contact with the crucible, and a second block located under the first block, comprising an alumina-based ceramic and not in contact with the crucible.

[7] The gallium oxide crystal manufacturing device according to any one of [1] to [6] set forth above, wherein the furnace inner tube is surrounded by a heat-retention layer from side, above and below, the heat-retention layer is vertically separated into two sections, an upper heat-retention layer and a lower heat-retention layer, the upper heat-retention layer and the lower heat-retention layer vertically sandwich a gap, and the gap is provided so as not to be horizontally continuous from the inside to the outside of the heat-retention layer.

Advantageous Effects of the Invention

According to an embodiment of the invention, a gallium oxide crystal manufacturing device can be provided that is configured to obtain a gallium oxide single crystal having a large size and including little crystal defects to cause a degradation in crystalline quality in the crystal growth by the vertical Bridgman method.

DESCRIPTION OF EMBODIMENTS

Embodiment (Configuration of a Manufacturing Device)

Figure 1:
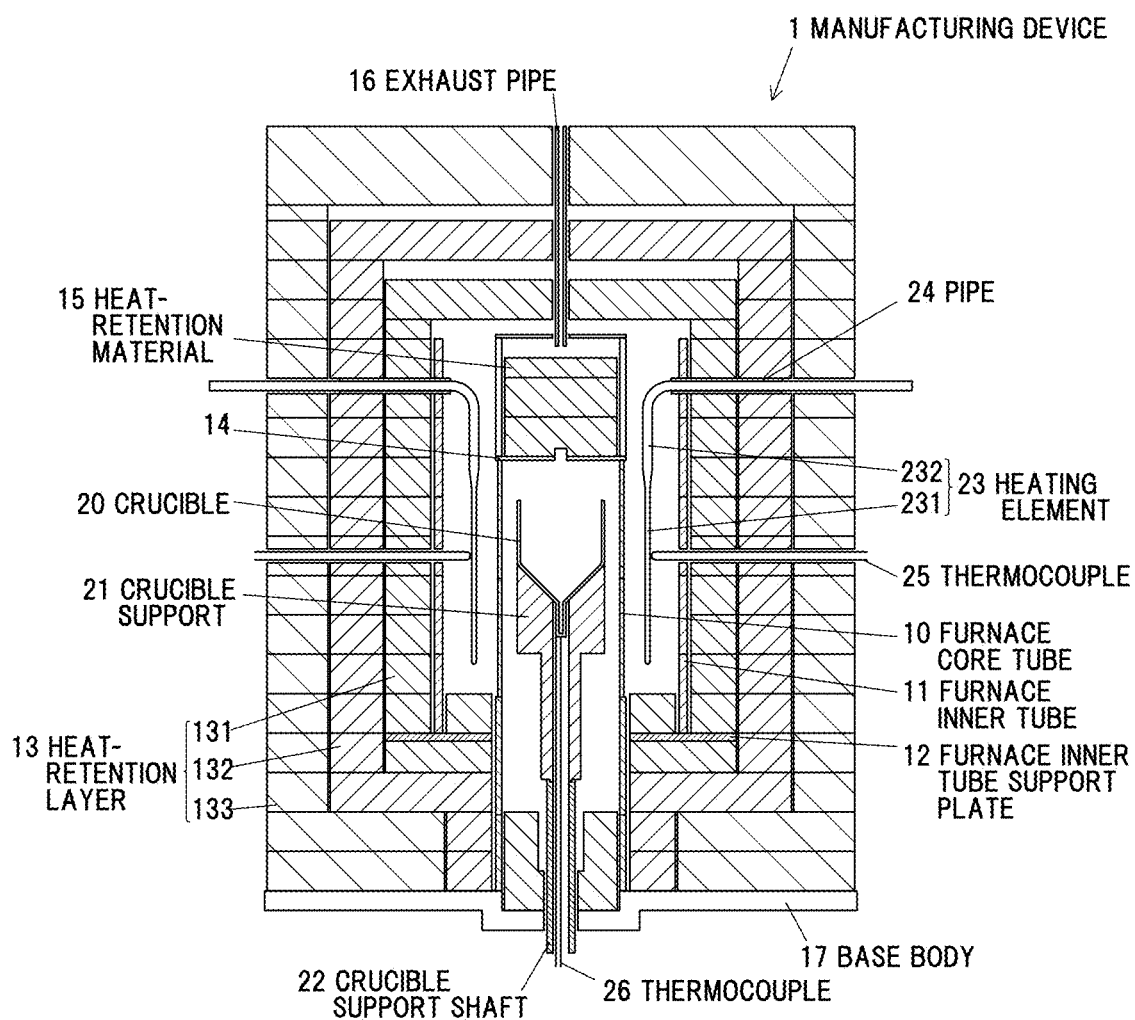
FIG. 1 is a vertical cross-sectional view showing a gallium oxide crystal manufacturing device in an embodiment of the present invention.

FIG. 1 is a vertical cross-sectional view showing the gallium oxide crystal manufacturing device 1 in an embodiment of the invention. The manufacturing device 1 is a device for growing a gallium oxide-based crystal by the vertical Bridgman method. Gallium oxide crystal here means a $\beta$-Ga$_2$O$_3$ crystal, or means a $\beta$-Ga$_2$O$_3$ crystal containing a substitutional impurity such as Al, In, or a dopant such a Sn, Si.

The manufacturing device 1 includes a crucible 20 to hold a gallium oxide source material therein, a crucible support 21 that supports the crucible 20 from below, a crucible support shaft 22 that is connected to the crucible support 21 from below and vertically movably supports the crucible 20 and the crucible support 21, a tubular furnace core tube 10 that surrounds the crucible 20, the crucible support 21 and the crucible support shaft 22, a tubular furnace inner tube 11 that surrounds the furnace core tube 10, and heating elements 23 each with heat-generating portions 231 placed in a space between the furnace core tube 10 and the furnace inner tube 11.

The manufacturing device 1 also includes a furnace inner tube support plate 12 as a base of the furnace inner tube 11, a heat-retention layer 13 arranged on the outer side of the furnace inner tube 11 and suppressing outflow of heat to the outside of the device by surrounding a crystal growth space inside the furnace inner tube 11 from side, above and below, an exhaust pipe 16 extending from the inside of the manufacturing device 1 to the outside of the device through the heat-retention layer 13, and a base body 17 on which each component of the manufacturing device 1 is placed. Additionally, the outside of the heat-retention layer 13 may be covered with an outer wall (not shown).

The melting points of the furnace core tube 10 and the furnace inner tube 11 are not less than 1900° C., and the furnace core tube 10 and the furnace inner tube 11 can withstand high temperature used for growing gallium oxide. In addition, a softening point of the furnace inner tube 11 is preferably not less than 1800° C.

In general, in crystal growth by the vertical Bridgman method, it is difficult to grow a good-quality crystal when a gradient of temperature distribution around the crucible is large, and this tendency is more prominent when growing a crystal with a larger size. In the manufacturing device 1, a temperature distribution with a small gradient suitable for growing a good-quality and large-size gallium oxide crystal can be produced around the crucible 20 by controlling a flow of heat around the crucible 20 using the furnace core tube 10.

To produce a temperature distribution with a smaller gradient around the crucible 20, the furnace core tube 10 preferably has a large thermal conductivity and it is preferable to use a dense and highly pure alumina-based ceramic or magnesia-based ceramic, etc., as a material. For example, 4NA manufactured by TEP Corporation can be suitably used as the material of the furnace core tube 10.

In addition, the furnace core tube 10 separates the crucible 20 from the heating element 23 and thereby can suppress incorporation of (contamination with) impurities such as Si, Mo from the heating element 23.

By using the furnace inner tube 11, it is possible to suppress a flow of heat from the heating element 23 and reduce wear of the heating element 23. For this reason, the furnace inner tube 11 is preferably excellent in thermal shock resistance and preferably has a lower thermal conductivity than that of the furnace core tube 10. Thus, the furnace inner tube 11 is preferably formed of a material, such as a porous zirconia-based ceramic, having a lower thermal conductivity than that of a dense and highly pure alumina-based ceramic or magnesia-based ceramic that is the material of the furnace core tube 10, and it is possible to suitably use, e.g., ZIR-Y manufactured by TEP Corporation as the material of the furnace core tube 10.

When the zirconia-based ceramic is used as the material of the furnace inner tube 11, the furnace inner tube 11 is arranged so that a portion to be heated to 1800° C. is not in contact with other members since it is likely to react with other materials.

The furnace inner tube 11 can also suppress local sintering or deformation of the heat-retention layer 13 that is arranged on the outer side of the furnace inner tube 11.

The furnace core tube 10 and the furnace inner tube 11 typically has a round tube shape. The furnace core tube 10 and the furnace inner tube 11 can be respectively formed by stacking annular (typically circular ring-shaped) members with different outer and inner diameters. In addition, the annular member constituting the furnace inner tube 11 may be a combination of plural divided pieces that are divided by plural straight lines extending from the center of the ring to the outer circumference.

The heat-retention layer 13 is configured that plural layers are superimposed from the inner side (the crucible 20 side) toward the outside in a nesting manner as shown in FIG. 1, and it is preferably configured that the innermost layer among the plural layer has the highest heat-resistant temperature and the layer closer to the outside has a lower heat-resistant temperature. A heat-retention material used for the heat-retention layer 13 is more expensive when having a higher heat-resistant temperature. Therefore, by configuring as described above, it is possible to reduce the cost while ensuring heat resistance of the heat-retention layer 13.

For example, in the example shown in FIG. 1, a layer 131 located innermost is formed of an alumina-based fiber board having a heat-resistant temperature of about 1800° C., a layer 132 therearound is formed of an alumina-based fiber board having a heat-resistant temperature of about 1700° C., and a layer 133 located outermost is formed of an inorganic material-based fiber board having a heat-resistant temperature of about 1400° C.

The layer 131, the layer 132 and the layer 133 can be respectively formed by stacking annular (typically circular ring-shaped) members with different outer and inner diameters. In addition, the annular member constituting the layer 131, the layer 132, the layer 133 may be a combination of plural divided pieces that are divided by plural straight lines extending from the center of the ring to the outer circumference. In this case, to increase heat retaining properties, it is preferable to stack the annular members so that boundaries of the adjacent divided pieces of the annular members do not overlap vertically and do not overlap inside and outside.

Figure 2:
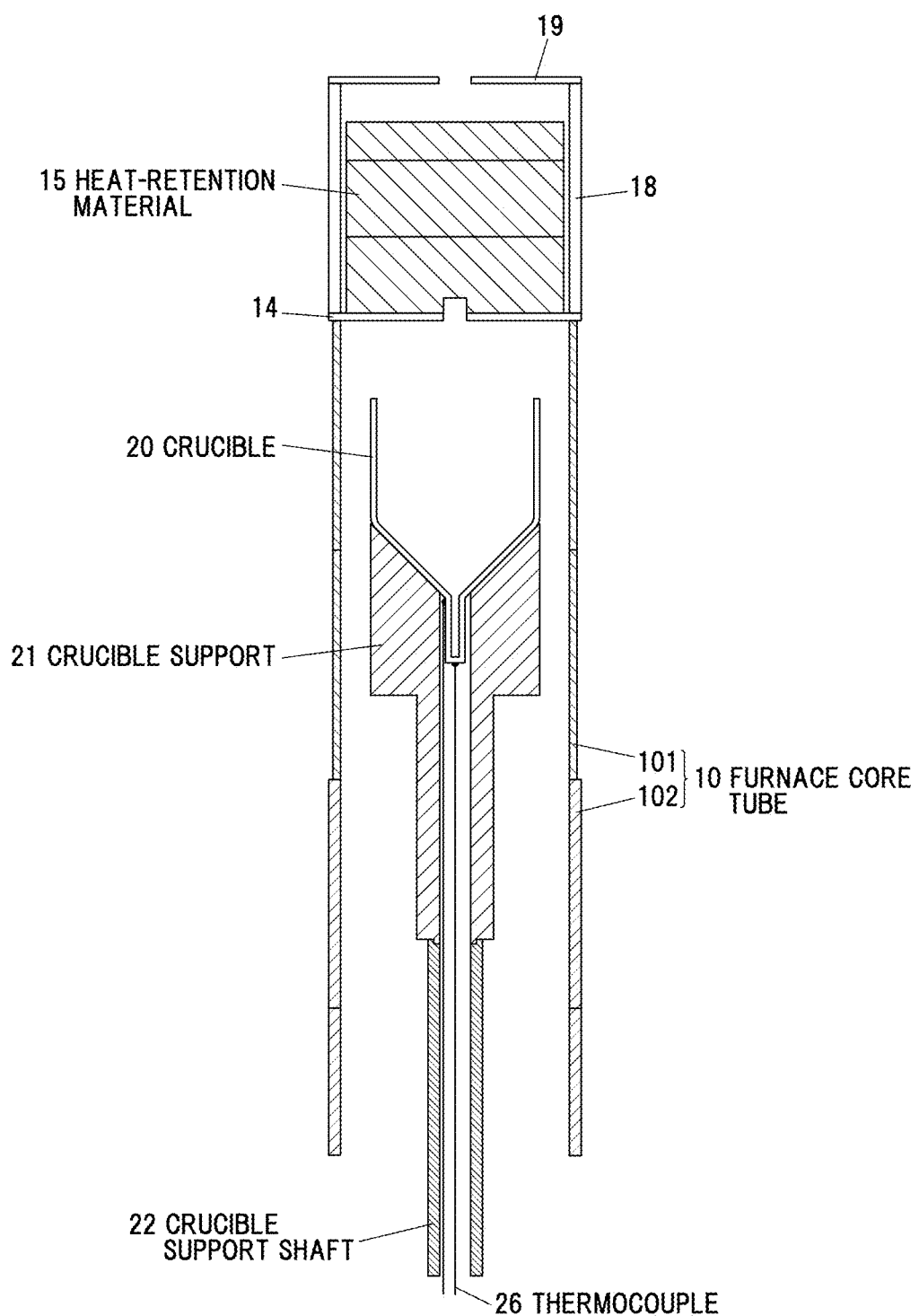
FIG. 2 is an enlarged cross-sectional view showing a furnace core tube and members therearound in the embodiment of the invention.

FIG. 2 is an enlarged cross-sectional view showing the furnace core tube 10 and members therearound. As shown in FIG. 2, the furnace core tube 10 may be configured that a portion 101 including a portion located directly next to the crucible 20 in a radial direction of the furnace core tube 10 and a remaining portion 120 are formed of different materials.

In this case, the portion 101 close to the crucible 20 preferably has a high thermal conductivity to provide a desired temperature distribution around the crucible 20 as described above and it is preferable to use a dense and highly pure alumina-based ceramic or magnesia-based ceramic, etc., as a material. On the other hand, the portion 102 which is relatively far from the crucible 20 is preferably excellent in thermal shock resistance and is preferably formed of a material, such as a porous zirconia-based ceramic, having a lower thermal conductivity than that of a dense and highly pure alumina-based ceramic or magnesia-based ceramic that is the material of the portion 101.

When the furnace core tube 10 is composed of the portion 101 and the portion 102, the thermal conductivity of the portion 101 is higher than the thermal conductivity of the portion 102. In addition, regardless of the configuration of the furnace core tube 10, the thermal conductivity of the portion of the furnace core tube 10 located directly next to the crucible 20 in a radial direction of the furnace core tube 10 is higher than the thermal conductivity of the furnace inner tube 11.

In addition, a heat-retention material 15 may be placed on the furnace core tube 10, as shown in FIG. 2. Use of the heat-retention material 15 helps to prevent heat around the crucible 20 from escaping upward and it is thereby easy to produce a desired temperature distribution. The heat-retention material 15 is placed on a plate-shaped member 14 that covers an opening at an upper end of the furnace core tube 10. Additionally, a tubular member 18 covering a side of the heat-retention material 15 and a plate-shaped member 19 covering the upper side may be used to suppress local sintering or deformation of the heat-retention material 15. The plate-shaped member 14 and the plate-shaped member 19 typically have a disk shape.

The heat-retention material 15 is formed of, e.g., the same material as the layer 131 of the heat-retention layer. All of the plate-shaped member 14, the tubular member 18 and the plate-shaped member 19 are formed of a material having a melting point of not less than 1900° C., such as an alumina-based ceramic or a magnesia-based ceramic.

The crucible 20 is formed of a platinum-based alloy such as platinum-rhodium alloy. Since the platinum-based alloy is hardly oxidized even in an oxygen atmosphere unlike iridium that is generally used as a material of a crucible for growing gallium oxide crystal, it is possible to grow gallium oxide in an air atmosphere by using the crucible 20 formed of platinum-rhodium alloy. Gallium oxide has little oxidizing power and decomposes into gallium and oxygen at a temperature close to the melting point if oxygen is absent in the atmosphere. However, by performing growth in the air atmosphere containing oxygen, it is possible to obtain a good-quality gallium oxide single crystal with little oxygen defects.

The crucible 20 has a shape and size corresponding to a shape and size of a gallium oxide crystal to be grown. When growing, e.g., a crystal having a circular column-shaped constant diameter portion with a diameter of 2 inches, the crucible 20 having a circular column-shaped constant diameter portion with an inner diameter of 2 inches is used. Meanwhile, when growing a crystal having a constant diameter portion with a shape other than the circular column shape, e.g., with a quadrangular prism shape or a hexagonal prism shape, the crucible 20 having a quadrangular prism-shaped or hexagonal prism-shaped constant diameter portion is used. Additionally, a lid may be used to cover an opening of the crucible 20.

The crucible support shaft 22 can be vertically moved by a drive mechanism (not shown), and the crucible 20 supported by the crucible support 21 thereby can be vertically moved inside the furnace core tube 10. Additionally, the crucible support shaft 22 may be rotatably moved about a vertical direction by the drive mechanism. In this case, the crucible 20 supported by the crucible support 21 can be rotated inside the furnace core tube 10.

The crucible support 21 and the crucible support shaft 22 are tubular members inside which a thermocouple 26 for measuring a temperature of the crucible 20 runs. Each of the crucible support 21 and the crucible support shaft 22 is formed of, e.g., a material having a melting point of not less than 1900° C., such as heat-resistant ceramic.

Figure 3:
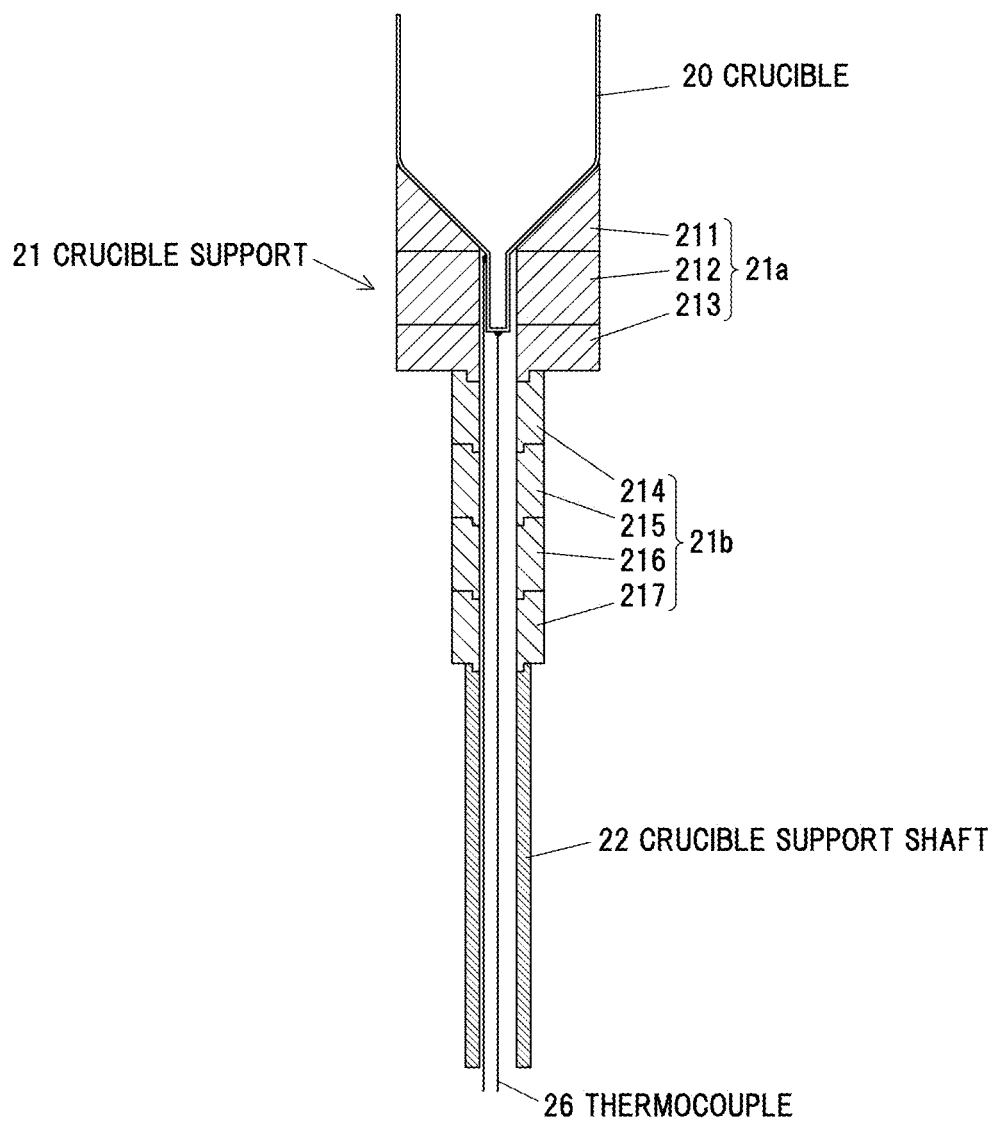
FIG. 3 is an enlarged cross-sectional view showing a crucible, a crucible support and a crucible support shaft in the embodiment of the invention.

FIG. 3 is an enlarged cross-sectional view showing the crucible 20, the crucible support 21 and the crucible support shaft 22. The crucible support 21 preferably has a block 21a as the uppermost portion formed of a zirconia-based ceramic and directly in contact with the crucible 20, and a block 21b that is located thereunder, is formed of an alumina-based ceramic and is not in contact with the crucible 20, as shown in FIG. 3. In addition, the block 21a may be composed of plural blocks (blocks 211-213 in the example shown in FIG. 3) that are connected in the vertical direction. Likewise, the block 21b also may be composed of plural blocks (blocks 214-217 in the example shown in FIG. 3) that are connected in the vertical direction.

The alumina-based ceramic is excellent as a material of the crucible support 21 in terms of high thermal conductivity, but is disadvantageous in that it reacts with a platinum-rhodium alloy under high temperature conditions and its thermal shock resistance is low. Therefore, it is preferable that a zirconia-based ceramic not reacting with a crucible formed of a platinum-rhodium alloy even under high temperature conditions of more than 1830° C. and excellent in thermal shock resistance be used as the material of the block 21a in contact with the crucible 20 and an alumina-based ceramic be used as the material of the block 21b provided under the block 21a.

It is possible to suitably use, e.g., ZIR-Y manufactured by TEP Corporation as the material of the block 21a. Meanwhile, it is possible to suitably use, e.g., 4NA manufactured by TEP Corporation as the material of the block 21b. In this regard, a joint position between the block 21a formed of the zirconia-based ceramic and the block 21b formed of the alumina-based ceramic needs to be a position at which reaction does not occur even at high temperature.

The crucible support shaft 22 may be composed of plural blocks that are connected in the vertical direction, although not shown in FIG. 3.

Figure 4A:
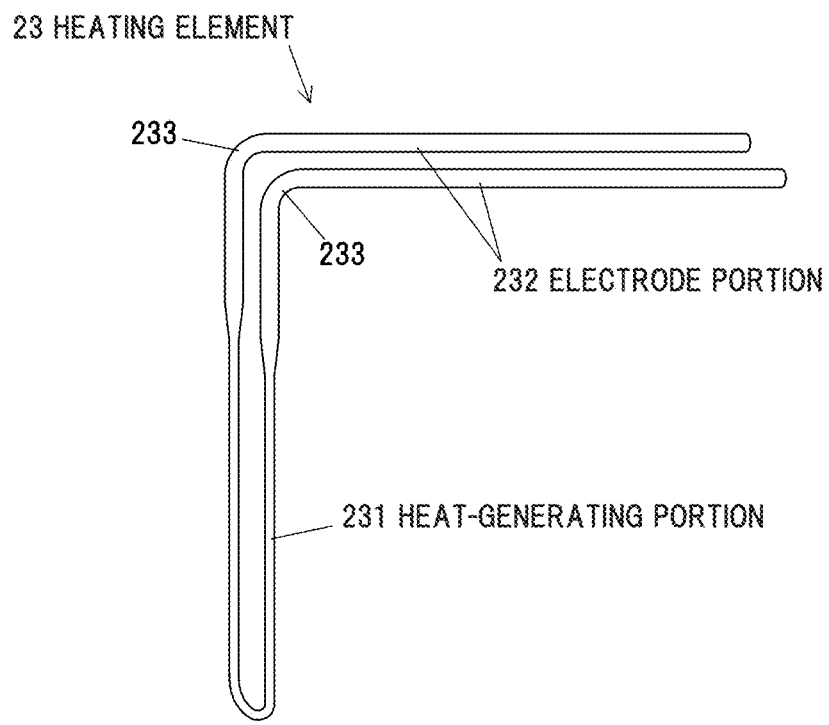
FIG. 4A is a perspective view showing a heating element in the embodiment of the invention.
Figure 4B:
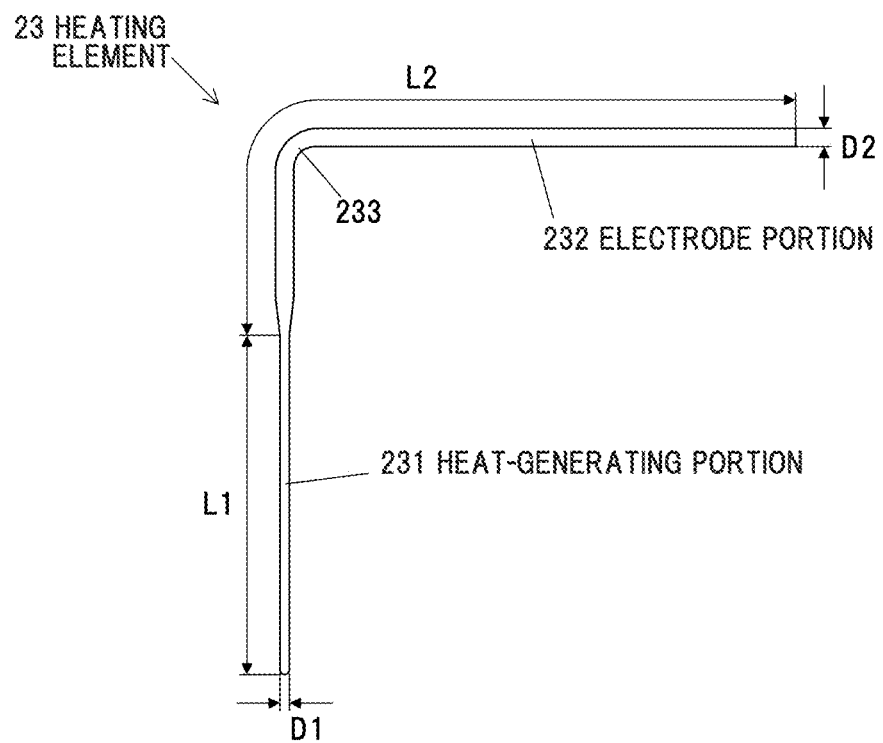
FIG. 4B is a side view showing the heating element in the embodiment of the invention.

FIGS. 4A and 4B are respectively a perspective view and a side view showing the heating element 23. The heating element 23 is a resistive heating element formed of molybdenum disilicide ($MoSi_2$), etc., that can be heated to a high temperature of not less than 1800° C. The heating element 23 has the U-shaped heat-generating portion 231 having a small diameter and generating heat upon application of an electrical current, and electrode portions 232 having a larger diameter than the heat-generating portion 231 and connected to an external device that supplies a current to the heating element 23.

In addition, the heating element 23 is bent into an L-shape at bent portions 233 of the electrode portions 232 and is fixed in a state that portions close to an end on the electrode portions 232 side relative to the bent portions 233 are inserted through holes horizontally penetrating the furnace inner tube 11 and the heat-retention layer 13. In the manufacturing device 1, plural (e.g., four to twelve) heating elements 23 are arranged so as to surround the furnace inner tube 11.

Regarding the heating element 23, a material of the heat-generating portion 231 generating high-temperature heat and a material of the electrode portions 232 serving to supply a current to such a heat-generating portion 231 and to mechanically stably hold the heat-generating portion 231 in an inner space of the high-temperature furnace are preferably the same or substantially the same, but a thickness (cross-sectional area) of the electrode portion 232 is preferably several times larger than that of the heat-generating portion 231. For example, when a ratio of a diameter D1 of the heat-generating portion 231 to a diameter D2 of the electrode portion 232, D1/D2, has a value of not more than 0.5, the cross-sectional area of the heat-generating portion 231 is not more than ¼ of the cross-sectional area of the electrode portion 232. In such a case, the mechanical strength of the electrode portion 232 is not less than four times the mechanical strength of the heat-generating portion 231, and the amount of heat generation per unit length of the heat-generating portion 231 is not less than four times the amount of heat generation per unit length of the electrode portion 232, which satisfy the function of the heating element 23 in terms of both the amount of heat generation and the mechanical strength. Therefore, D1/D2 is preferably not more than 0.5. However, considering the required amount of an expensive material, D1/D2 is preferably close to 0.5, and is preferably not less than 0.4.

In addition, the portion of the heating element 23 penetrating through the furnace inner tube 11 and the heat-retention layer 13 are preferably inserted into pipes 24 formed of sapphire, etc. By using the pipes 24, it is possible to thermally and electrically insulate the heating element 23 from the furnace inner tube 11 and suppress reaction between the heating element 23 and the furnace inner tube 11. When the furnace inner tube 11 is formed of a zirconia-based ceramic, reaction between the furnace inner tube 11 and the pipes 24 can be also suppressed by using the pipes 24 formed of sapphire. In addition, sapphire does not soften even at high temperature of about 1800° C. and is thus preferable as a material of the pipes 24. In addition, it is possible to mechanically support the bent portions 233 of the heating element 23 by the pipes 24 and thereby suppress damage on the heating element 23.

The manufacturing device 1 also includes thermocouples 25 for measuring temperature of the heating elements 23. The thermocouple 25 is inserted into the device through a hole horizontally penetrating the furnace inner tube 11 and the heat-retention layer 13 in such a manner that a tip thereof is located at substantially the same position as the heat-generating portion 231 of the heating element 23.

Figure 5:
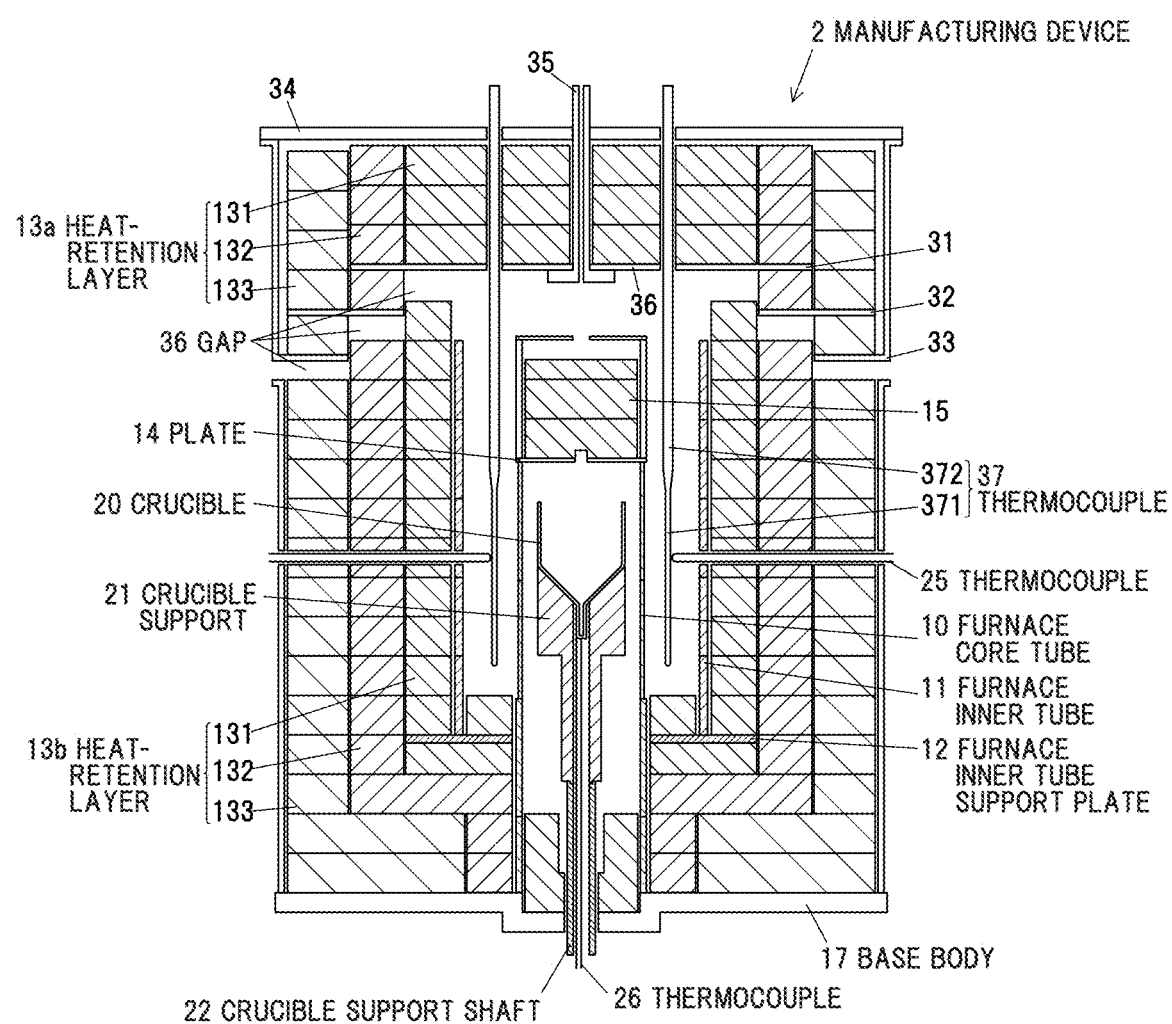
FIG. 5 is a vertical cross-sectional view showing a modification of a gallium oxide crystal manufacturing device 1 in the embodiment of the invention.

FIG. 5 is a vertical cross-sectional view showing a manufacturing device 2 that is modification of the gallium oxide crystal manufacturing device 1 in the embodiment of the invention. The manufacturing device 2 is different from the manufacturing device 1 mainly in the configuration of the heat-retention layer.

The heat-retention layer 13 in the manufacturing device 2 is vertically separated into two sections, an upper heat-retention layer 13a and a lower heat-retention layer 13b. Typically, it is configured that the heat-retention layer 13a covers the upper side of the furnace inner tube 11 and the heat-retention layer 13b covers the lateral and lower sides of the furnace inner tube 11, as shown in FIG. 5.

The heat-retention layer 13a is separated from the heat-retention layer 13b by heat-retention material support plates 31, 32, 33, 36 on which the heat-retention layer 13a is placed, a base body 34 supporting the outermost retention material support plate 33 and covering the upper surface of the heat-retention layer 13a, and a suspending member 35 that is fixed to the base body 34, suspends the base body 34 and the heat-retention material support plate 36 and thereby suspends the entire heat-retention layer 13a. Thus, a gap 36 is formed between the heat-retention layer 13a and the heat-retention layer 13b and it is thereby possible to suppress contact with one another due to vertical expansion and contraction of the layers 131, 132, 133 caused by a difference in thermal expansion coefficient between the layers 131, 132, 133 constituting the heat-retention layer 13a.

In more particular, in a region on the outer side of heating elements 37, the base body 34 which moves vertically supports the heat-retention material support plate 33 on which a portion of the heat-retention layer 133, the heat-retention material support plate 32, a portion of the heat-retention layer 132, the heat-retention material support plate 31 and a portion of the heat-retention layer 131 are placed in this order. Then, a portion of the heat-retention layer 131 located on the inner side of the heating element 37 is supported by the heat-retention material support plate 36 suspended by the suspending member 35.

In addition, separation surfaces at which the layers 131, 132, 133 are separated between the heat-retention layer 13a and the heat-retention layer 13b have different heights so that the separation surfaces between the heat-retention layer 13a and the heat-retention layer 13b form a step shape. Thus, by adjusting a gap between the heat-retention layer 13a and the heat-retention layer 13b so that the gap 36 between the heat-retention layer 13a and the heat-retention layer 13b is not horizontally continuous from the inside to the outside of the heat-retention layer 13, it is possible to suppress outflow of heat through the gap 36 to the outside of the device.

In this regard, the method for arranging the heat-retention layer 13a and the heat-retention layer 13b so as to have a gap is not limited to the above-mentioned method shown in FIG. 5.

In the example shown in FIG. 5, the straight heating elements 37 are used in the manufacturing device 2. The heating element 37 has a heat-generating portion 371 and an electrode portion 372 similar to the heat-generating portion 231 and the electrode portions 232 of the heating element 23, is inserted into the device through a hole vertically penetrating the base body 34, the heat-retention layer 13a and the heat-retention material support plate 31, and is fixed. Alternatively, the L-shaped heating element 23 inserted through a hole provided in the heat-retention layer 13a may be used in the same manner as the manufacturing device 1.

(Method for Manufacturing a Gallium Oxide Crystal)

Firstly, a gallium oxide source material such as a β-$Ga_2O_3$ sintered body is introduced into the crucible 20. To obtain a good-quality crystal, a purity of the gallium oxide source material is preferably not less than 5N. At this time, a seed crystal may or may not be placed on the bottom of the crucible 20.

Next, by heating the inside of the manufacturing device 1 (or the inner side of the heat-retention layer 13) using the heating element 23, a temperature gradient is produced around the crucible 20 so that the temperature on the upper side is high and the temperature on the lower side is low, thereby melting the gallium oxide source material in the crucible 20. In particular, a temperature distribution, in which the temperature gradient along the vertical direction at around the melting point of gallium oxide (about 1795° C.) is 1-10° C./cm, is produced. The manufacturing device 1, 2 provided with the furnace core tube 10 and the furnace inner tube 11 can stably produce such a temperature distribution with a low temperature gradient and thus can grow a gallium oxide single crystal that has a large-size constant diameter portion with a diameter of not less than 2 inches and contains little crystal defects.

In a typical method, firstly, the height of the crucible 20 is adjusted by vertically moving the crucible support shaft 22 so that temperature in an upper region inside the crucible 20 is elevated to not less than the melting point of gallium oxide. An upper portion of the source material inside the crucible 20 is thereby melted. Next, the crucible support shaft 22 is moved upward to melt the source material to the lower side while raising the crucible 20 at a predetermined speed (e.g., 1-15 mm/h), thereby eventually melting the entire source material and a portion of the seed crystal. Next, the crucible support shaft 22 is moved downward to crystalize the melt from the lower side (the seed crystal side) while lowering the crucible 20 at a predetermined speed (e.g., 1-15 mm/h), thereby growing a single crystal. Optionally, during melting of the source material or crystallization of the melt, the temperature inside the manufacturing device 1 may be increased or decreased by controlling temperature of heat generated by the heating element 23, in addition to raising and lowering of the crucible 20. After the gallium oxide melt is completely crystallized, the crucible 20 is removed and a grown crystal is taken out.

The above crystal growth of gallium oxide is performed in an air atmosphere or in a mixture gas atmosphere of an $O_2$ gas and an inert gas or neutral gas. In addition, when an oxygen concentration in a high temperature zone of not less than 1770° C. is maintained in a range of more than 20% and not more than 50% by supplying an oxygen concentration adjustment gas, it is possible to grow a crystal with fewer oxygen defects than when growing in an air atmosphere with an oxygen concentration of about 20%.

(Characteristics of Gallium Oxide Crystal and Wafer)

A gallium oxide single crystal (ingot) having a circular column-shaped constant diameter portion with a diameter of not less than 2 inches can be obtained by crystal growth using the above-described manufacturing devices 1, 2 in the present embodiment, and a circular gallium oxide single crystal wafer with a diameter of not less than 2 inches can be cut out of it.

In addition, by crystal growth using the manufacturing devices 1, 2 in the present embodiment, it is possible to obtain a gallium oxide single crystal having a circular column-shaped constant diameter portion with a diameter up to about 8 inches. For example, by installing the furnace inner tube 11 into which the crucible 20 with a desired size in inches can be inserted, and by correspondingly enlarging the inner diameter of the heat-retention layer 13 in a radial direction, it is possible to obtain a gallium oxide single crystal having a constant diameter portion with any diameter up to about 8 inches.

It is also possible to grow a crystal having a polygonal prism-shaped constant diameter portion. In this case, it is preferable to grow a crystal that a size of a cross section of the constant diameter portion orthogonal to the crystal growth direction fits inside a circle of not less than 2 inches, so that a circular wafer with a diameter of not less than 2 inches can be cut out. When growing, e.g., a crystal having a quadrangular prism-shaped constant diameter portion, it is preferable to grow a crystal in which a cross section orthogonal to the crystal growth direction is square with one side of not less than 2 inches.

A concentration of Ir contained in a gallium oxide single crystal obtained using the manufacturing device 1 or 2 and a wafer cut out of it in the present embodiment is not more than 0.01 ppm. ppm here is a ratio of weight. 0.01 ppm is the lower limit of detection by a GDMS (glow-discharge mass spectrometry) measurement device, and not more than 0.01 ppm means that Ir cannot be detected by the GDMS measurement device.

Since the crucible 20 formed of a platinum-based alloy not containing Ir is used, the Ir concentration in the gallium oxide single crystal and the wafer in the present embodiment is low. In this regard, when a crucible formed of Ir is used instead of the crucible 20, the Ir concentration in the obtained gallium oxide single crystal is several to several tens of ppm.

Since the Ir concentration in the gallium oxide single crystal and the wafer in the present embodiment is low, a decrease in carrier mobility due to impurity scattering is suppressed. In addition, since the Ir concentration is low, there are few voids. It is considered that a gallium oxide single crystal grown by the EFG method using a crucible formed of Ir contains many voids due to a high Ir concentration. In addition, since light scattering by Ir is reduced when the Ir concentration is low, it is advantageous in optical applications.

The gallium oxide single crystal wafer in the present embodiment includes plural 1 mm×1 mm regions having a dislocation density of not more than 1000/cm$^2$. Then, an average of the full width at half maximum of a XRD diffraction peak from a (001) plane of the gallium oxide single crystal and the wafer in the present embodiment is not more than 20 arcsec.

When using the crucible 20 formed of a platinum-rhodium alloy, an Rh concentration in the gallium oxide single crystal and the wafer in the present embodiment falls within a range of not less than 10 ppm and not more than 40 ppm. Rh in gallium oxide acts as an acceptor and is thus advantageous when used as a material of a high-resistance substrate.

In addition, the Rh concentration in the gallium oxide single crystal in the present embodiment is characterized by being substantially uniform along a length direction (the crystal growth direction) and a radial direction. Since a gradient of the Rh concentration is largest in the length direction of the gallium oxide single crystal and the Rh concentration in the gallium oxide single crystal falls within a range of not less than 10 ppm and not more than 40 ppm as described above, a difference between the maximum and minimum values of the Rh concentration in the length direction is not more than 30 ppm. In addition, a difference between the maximum and minimum values of the Rh concentration in the radial direction is far smaller than the difference between the maximum and minimum values of the Rh concentration in the length direction. Therefore, the in-plane concentration of Rh in the wafer cut out of the gallium oxide single crystal is substantially uniform, and there is little variation in the Rh concentration between wafers. For example, when forming a high-resistance gallium oxide substrate, Fe or Mg is generally added. Uniformity of the Rh concentration in the in-plane direction in the gallium oxide single crystal wafer in the present embodiment is higher than uniformity of the Fe or Mg concentration in the in-plane direction in such as case.

In addition, in crystal growth using the manufacturing devices 1, 2 in the present embodiment, it is possible to grow a gallium oxide single crystal having a size big enough to cut out the above-described wafer with a diameter of not less than 2 inches and not containing twins.

In addition, in crystal growth using the manufacturing device 1, 2 in the present embodiment, when not less than 0.1 mol % of Sn is added to the gallium oxide source material with a purity of not less than 5N during growth, an n-type carrier concentration in the gallium oxide single crystal and the wafer is not less than 3×10$^{18}$ cm$^{-3}$. It can be said that this carrier concentration is suitable as a carrier concentration in an n-type low-resistance semiconductor substrate required for making a Schottky barrier diode.

Effects of the embodiment With the manufacturing devices 1 and 2 including the furnace core tube 10 and the furnace inner tube 11 in the present embodiment, it is possible to grow a gallium oxide single crystal having a large size enough to cut out a circular wafer with a diameter of not less than 2 inches and containing little crystal defects causing crystalline quality degradation.

(Example)

Next, the results of evaluating the characteristics of a gallium oxide single crystal (ingot) obtained by crystal growth using the manufacturing device 1 in the present embodiment described above and a wafer cut out of it will be described. Each of gallium oxide single crystals in the present Example is a β-Ga$_2$O$_3$ single crystal grown using a seed crystal formed of a β-Ga$_2$O$_3$ single crystal that is placed on the bottom of the platinum-rhodium alloy crucible 20 with a circular column-shaped constant diameter portion.

Figure 6:
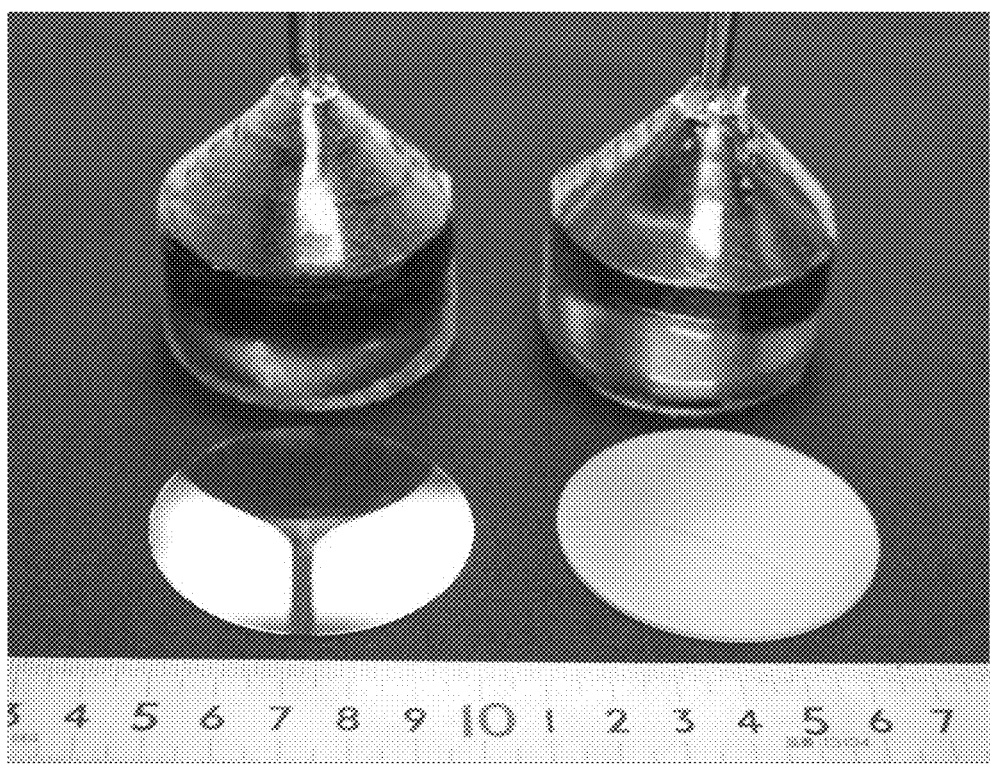
FIG. 6 is a photograph showing two $\beta$-Ga$_2$O$_3$ single crystals, which are among gallium oxide single crystals in Example and each have a circular column-shaped constant diameter portion with a diameter of 2 inches, and two wafers cut out of them.

FIG. 6 is a photograph showing two β-Ga$_2$O$_3$ single crystals, which are among gallium oxide single crystals in the present Example and each have a circular column-shaped constant diameter portion with a diameter of 2 inches, and two wafers cut out of them. The two gallium oxide single crystals shown in FIG. 6 both have a (001) plane on the cross section of the constant diameter portion taken in the radial direction, and wafers having a (001) plane on the principal surface can be cut out of them by slicing in the radial direction.

Figure 7:
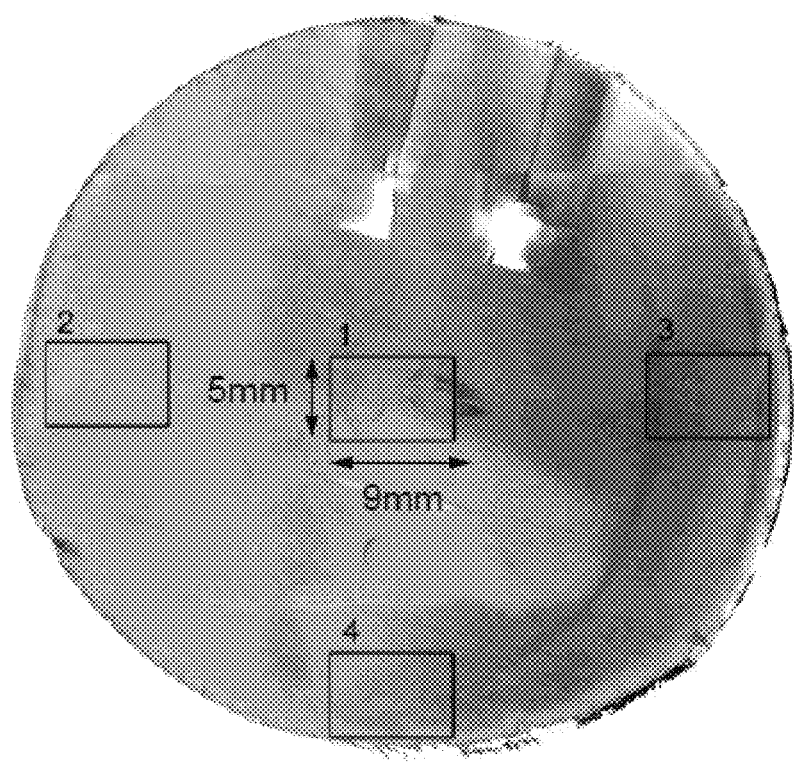
FIG. 7 is an observation image obtained by X-ray topography and showing a gallium oxide single crystal wafer that is cut out of a gallium oxide single crystal in Example, is doped with 0.2 mol % Sn and has a (001) plane on a principal surface.
Figure 8A:
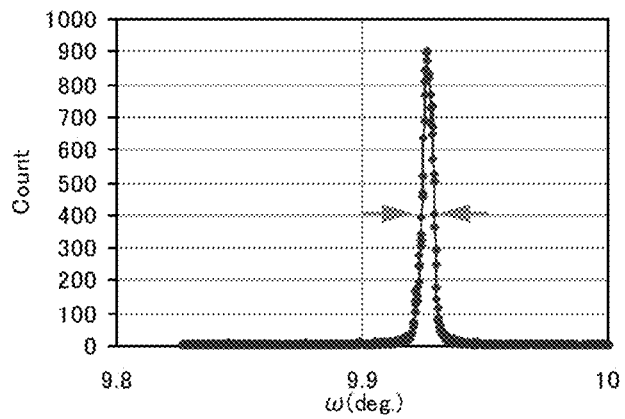
FIG. 8A shows a (001) plane diffraction peak in region 1 on the wafer shown in FIG. 7 obtained by X-ray rocking curve measurement.
Figure 8B:
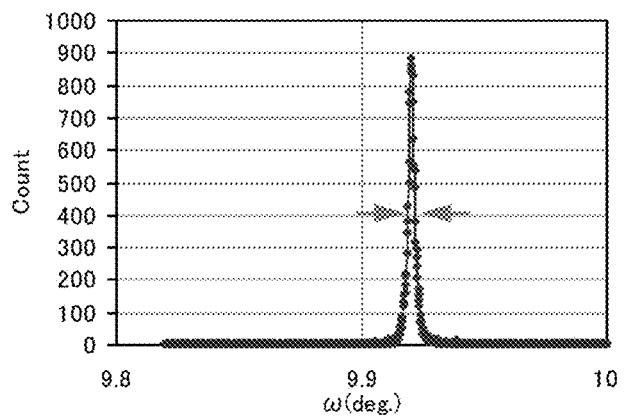
FIG. 8B shows a (001) plane diffraction peak in region 2 on the wafer shown in FIG. 7 obtained by X-ray rocking curve measurement.
Figure 8C:
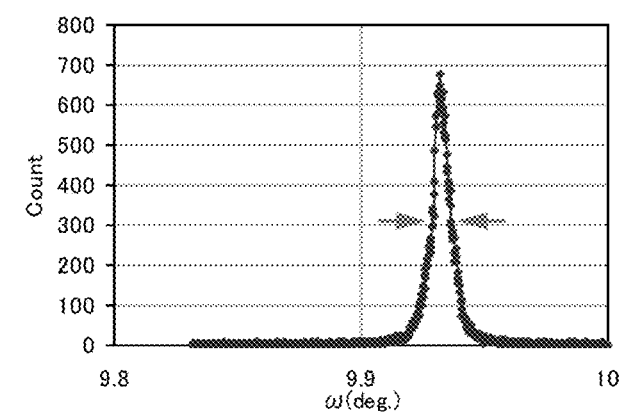
FIG. 8C shows a (001) plane diffraction peak in region 3 on the wafer shown in FIG. 7 obtained by X-ray rocking curve measurement.
Figure 8D:
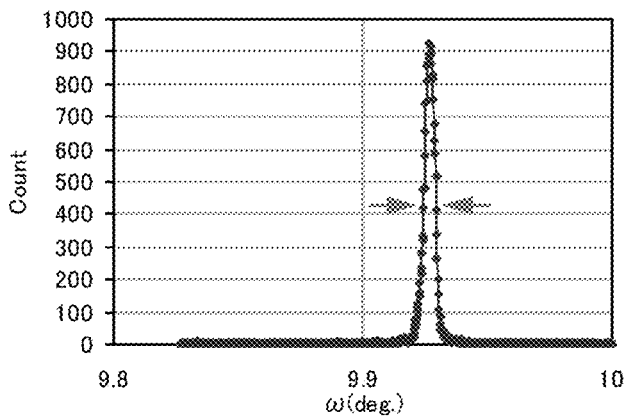
FIG. 8D shows a (001) plane diffraction peak in region 4 on the wafer shown in FIG. 7 obtained by X-ray rocking curve measurement.

FIG. 7 is an observation image obtained by X-ray topography and showing a gallium oxide single crystal wafer that is cut out of a gallium oxide single crystal in the present Example, is doped with 0.2 mol % Sn and has a (001) plane on a principal surface. FIGS. 8A to 8D each show (001) plane diffraction peaks in regions 1 to 4 on the wafer shown in FIG. 7 obtained by X-ray rocking curve measurement.

Table 1 below shows full width at half maximum (degree, arcsec) of (001) plane diffraction peaks that are from the regions 1 to 4 and are shown in FIGS. 8A to 8D.

TABLE 1

| | Full width at half maximum | |
|---|---|---|
| | Degree | arcsec |
| Region 1 | 0.0048 | 17.3 |
| Region 2 | 0.0024 | 8.6 |
| Region 3 | 0.0066 | 23.8 |
| Region 4 | 0.0048 | 17.3 |
| Average | 0.0047 | 16.8 |

Figure 9:
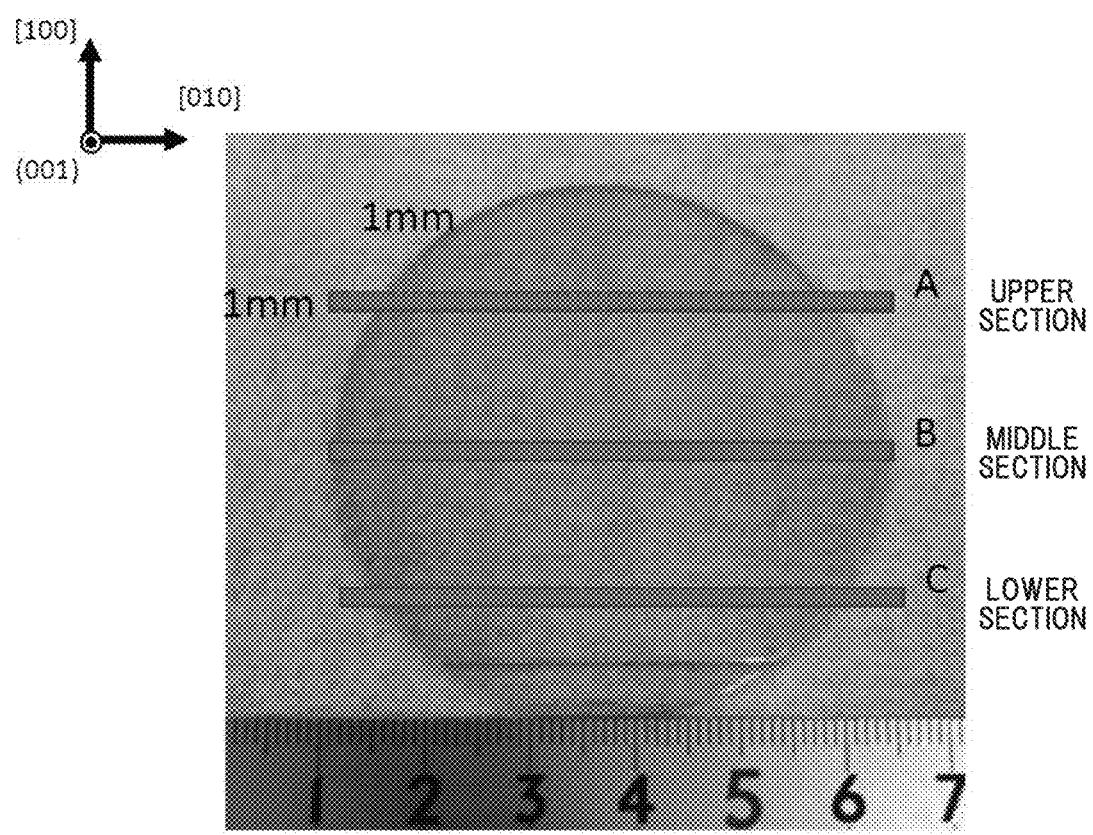
FIG. 9 is a photograph showing a gallium oxide single crystal wafer in Example that is doped with 0.2 mol % Sn and has a (001) plane on a principal surface.
Figure 10:
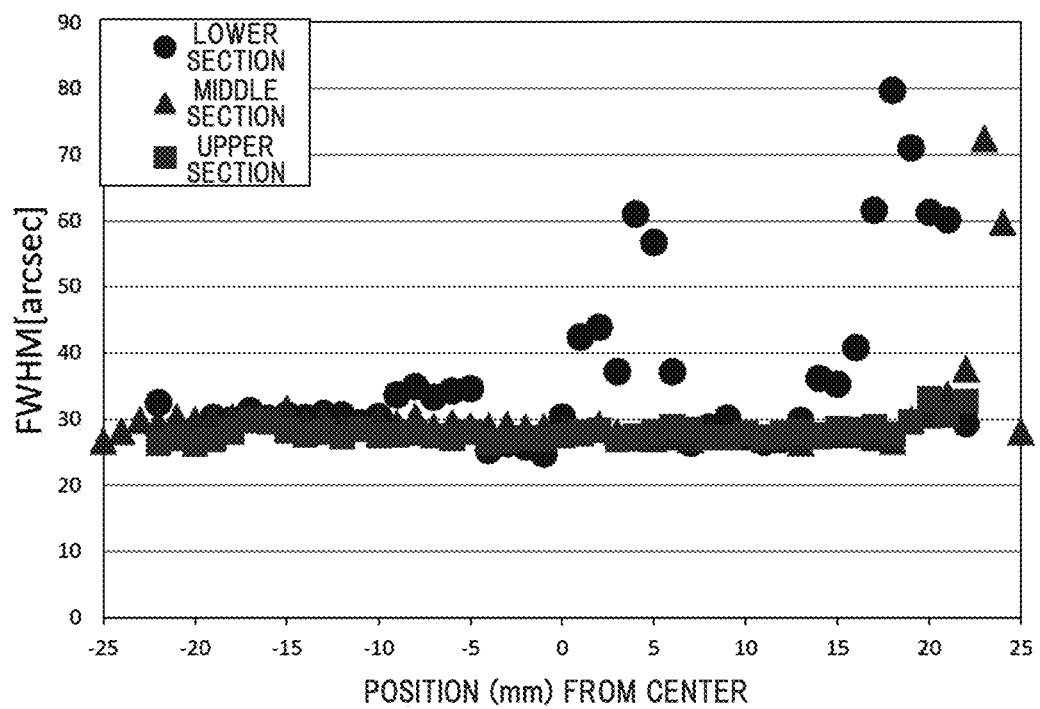
FIG. 10 is a graph obtained by X-ray rocking curve measurement and showing a distribution of full width at half maximum of (001) plane diffraction peak on the wafer shown in FIG. 9.

FIG. 9 is a photograph showing a gallium oxide single crystal wafer in the present Example that is doped with 0.2 mol % Sn and has a (001) plane on a principal surface. FIG. 10 is a graph obtained by X-ray rocking curve measurement and showing a distribution of full width at half maximum of (001) plane diffraction peak on the wafer shown in FIG. 9. "Upper section", "middle section" and "lower section" in FIG. 10 indicate full width at half maximum of diffraction peaks measured at 1 mm×1 mm intervals respectively along straight lines A, B and C in FIG. 9.

It is considered that crystal defects are present at positions with high full width at half maximum. It is therefore considered that, according to FIG. 10, crystal defects are not present in the upper section, crystal defects are present in a range of 20 to 25 mm in the middle section, and crystal defects are present in a range of −10 to −5 mm, 0 to 5 mm and 15 to 20 mm in the lower section. In this regard, an Sn concentration in the gallium oxide single crystal wafer does not affect the full width at half maximum of the diffraction peak.

Figure 11:
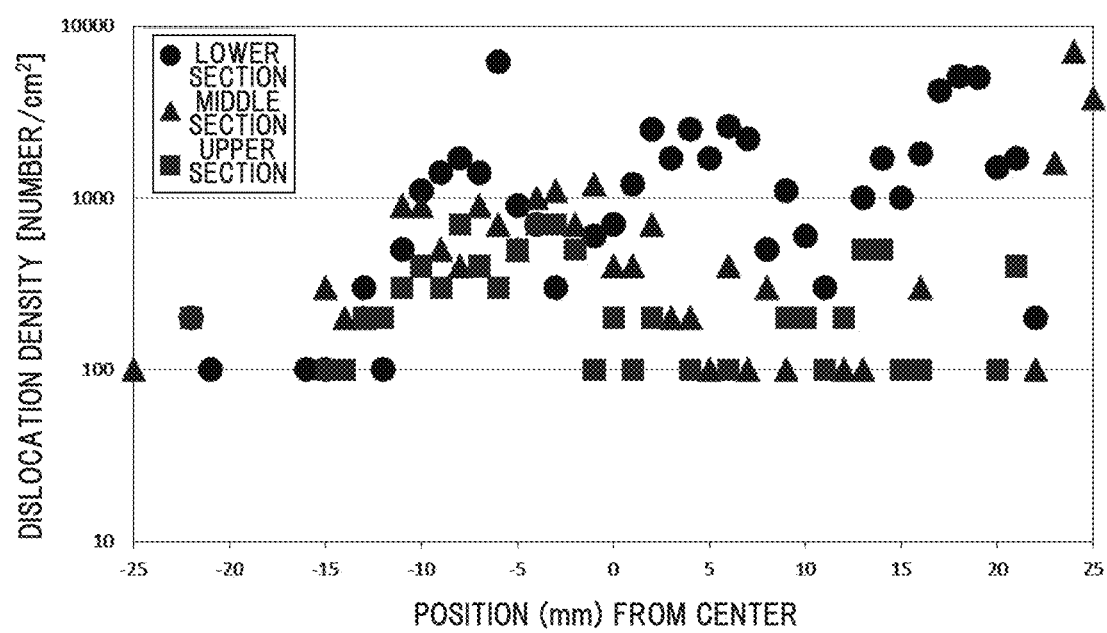
FIG. 11 is a graph showing a distribution of dislocation density on the wafer shown in FIG. 9.

FIG. 11 is a graph showing a distribution of dislocation density on the wafer shown in FIG. 9. "Upper section", "middle section" and "lower section" in FIG. 11 indicate dislocation density measured at 1 mm×1 mm intervals respectively along the straight lines A, B and C in FIG. 9. To measure the dislocation density, the surface of the wafer was etched with potassium hydroxide (KOH), and formed etch pits were observed. According to FIG. 11, plural 1 mm×1 mm regions with a dislocation density of not more than 1000/cm² are contained in the wafer.

Figure 12A:
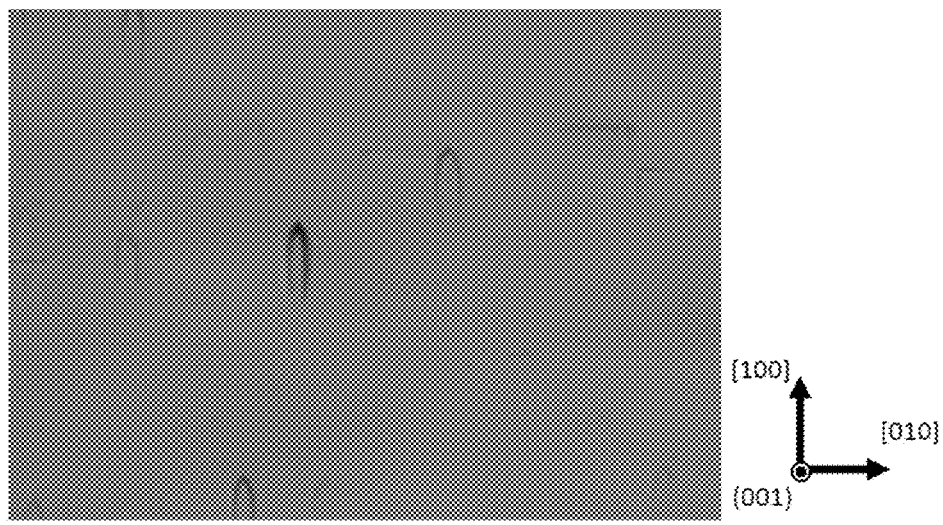
FIG. 12A is an observation image taken by an optical microscope and showing an example of an etch pit appeared on a wafer surface.
Figure 12B:
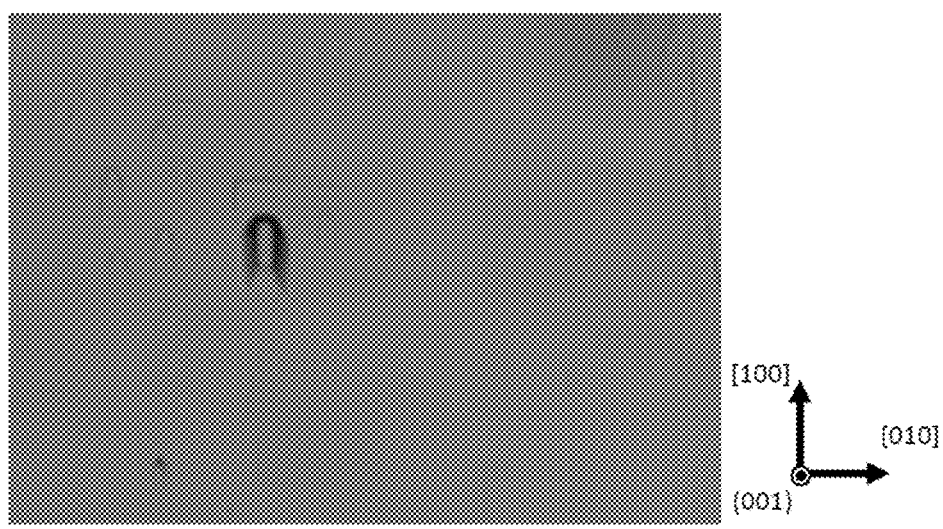
FIG. 12B is an observation image taken by an optical microscope and showing an example of an etch pit appeared on a wafer surface.
Figure 12C:
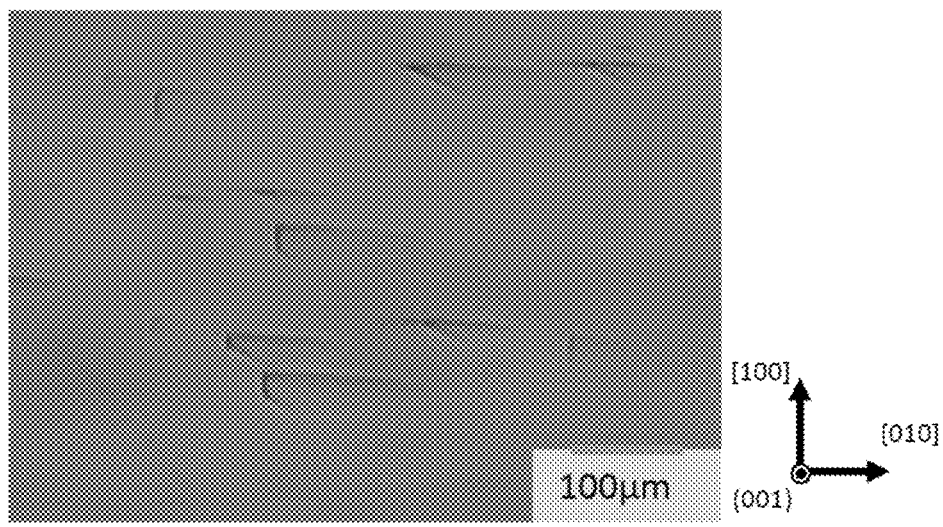
FIG. 12C is an observation image taken by an optical microscope and showing an example of an etch pit appeared on a wafer surface.

FIG. 12A to 12C are observation images taken by an optical microscope and showing examples of etch pits appeared on wafer surfaces. Here, it was determined that bullet-shaped etch pits with cores as shown in FIGS. 12A and 12B are caused by dislocations, and the number of such etch pits was counted as the number of dislocations. On the other hand, it was not determined that etch pits without cores shown in FIG. 12C are caused by dislocations. Magnifications of the observation images in FIGS. 12A to 12C are the same.

Figure 13A:
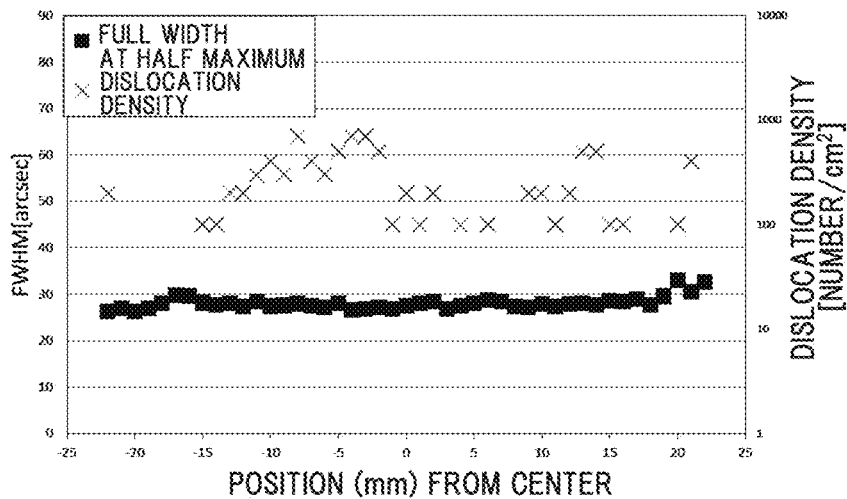
FIG. 13A is a graph showing distributions of full width at half maximum of (001) plane diffraction peak and dislocation density at an upper section of the wafer shown in FIG. 9.
Figure 13B:
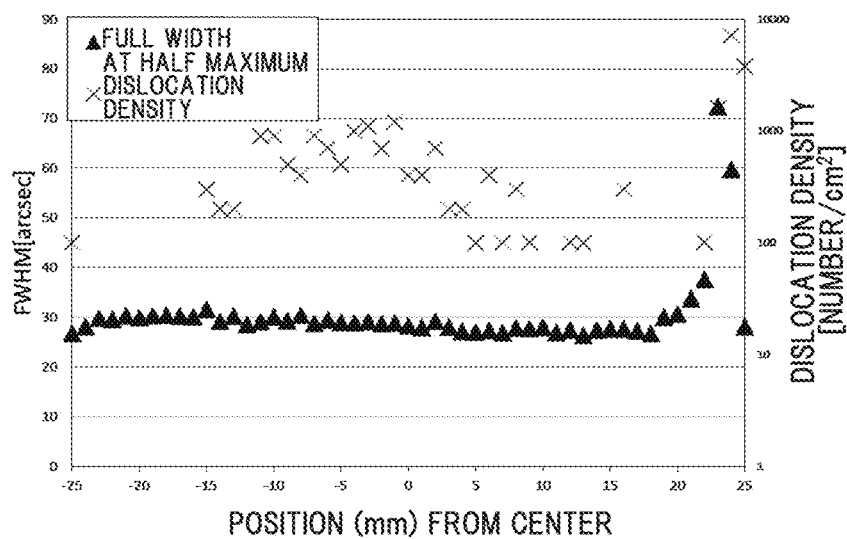
FIG. 13B is a graph showing distributions of full width at half maximum of (001) plane diffraction peak and dislocation density at a middle section of the wafer shown in FIG. 9.
Figure 13C:
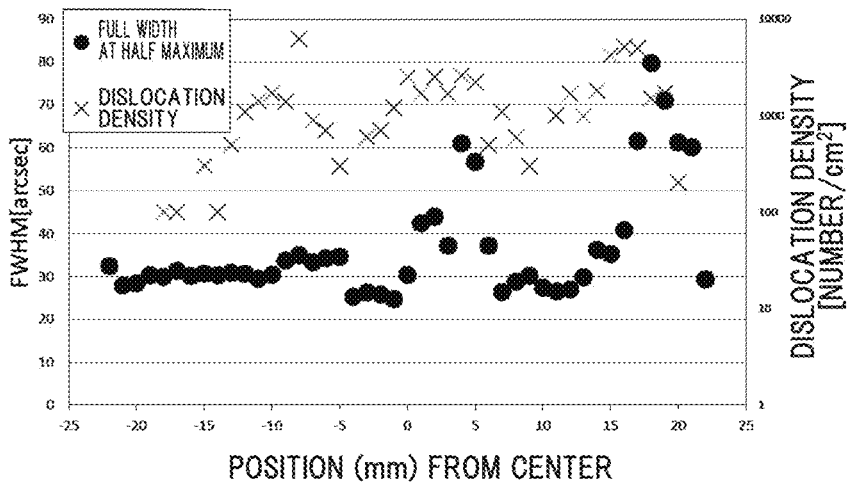
FIG. 13C is a graph showing distributions of full width at half maximum of (001) plane diffraction peak and dislocation density at a lower section of the wafer shown in FIG. 9.

FIGS. 13A, 13B and 13C are graphs showing distributions of full width at half maximum of (001) plane diffraction peak and dislocation density respectively at the upper section, the middle section and the lower section of the wafer shown in FIG. 9. According to FIGS. 13A, 13B and 13C, it is considered that the full width at half maximum of the (001) plane diffraction peak and the dislocation density are correlative to each other since the dislocation density is more than 1000/cm² at positions with particularly high full width at half maximum of the (001) plane diffraction peak and both have similar distribution tendencies. Although distribution tendencies around −10 mm in FIG. 13C do not match, the reason for this is considered that depressions caused by factors other than crystallinity (caused by polishing marks, etc.) were determined as etch pits caused by dislocations.

Concentrations of impurities contained in gallium oxide single crystals in the present Example and measured by GDMS are shown below. Table 2 shows concentrations of impurities contained in gallium oxide single crystal wafers not intentionally doped with Sn, Table 3 shows concentrations of impurities contained in gallium oxide single crystal wafers doped with 0.05 mol % Sn, Table 4 shows concentrations of impurities contained in gallium oxide single crystal wafers doped with 0.1 mol % Sn, and Table 5 shows concentrations of impurities contained in gallium oxide single crystal wafers doped with 0.2 mol % Sn. In addition, a unit of concentration, "ppm", is a ratio of weight.

TABLE 2

| | Concentration [ppm] | |
|---|---|---|
| Element | Solidification rate g = 0.5 | Solidification rate g = 0.9 |
| Na | 0.02 | 0.04 |
| Mg | 0.01 | 0.02 |
| Al | 0.44 | 0.41 |
| Si | 2.0 | 2.3 |

TABLE 2-continued

| | Concentration [ppm] | |
|---|---|---|
| Element | Solidification rate g = 0.5 | Solidification rate g = 0.9 |
| Ca | 0.19 | 0.52 |
| Fe | 1.3 | 2.3 |
| Zr | 1.0 | 2.1 |
| Sn | 0.20 | 0.50 |
| Pt | 0.03 | 0.02 |
| Rh | 29 | 32 |

TABLE 3

| Element | Concentration [ppm] |
|---|---|
| Na | <0.02 |
| Al | 0.34 |
| Si | 2.6 |
| Ca | 0.38 |
| Fe | 1.2 |
| Zr | 1.3 |
| Rh | 28 |
| Sn | 14 |
| Ir | <0.01 |
| Pt | 0.01 |

TABLE 4

| Element | Concentration [ppm] |
|---|---|
| Na | 0.40 |
| Al | 0.92 |
| Si | 6.2 |
| Ca | 0.39 |
| Fe | 2.4 |
| Zr | 10 |
| Rh | 27 |
| Sn | 73 |
| Ir | <0.01 |
| Pt | 0.01 |

TABLE 5

| Element | Concentration [ppm] |
|---|---|
| Na | 0.02 |
| Al | 0.97 |
| Si | 3.1 |
| Ca | 0.15 |
| Fe | 3.5 |
| Zr | 0.32 |
| Rh | 23 |
| Sn | 66 |
| Ir | <0.01 |
| Pt | <0.01 |

As shown in Tables 3 to 5, the concentration of Ir contained in these gallium oxide single crystals was not more than 0.01 ppm. In addition, as shown in Tables 2 to 5, the concentration of Rh contained in these gallium oxide single crystals fell within a range of not less than 10 ppm and not more than 50 ppm. It is considered that this is because the crucible 20 formed of a platinum-rhodium alloy not containing Ir was used.

In addition, according to Table 2, the Rh concentration at a position with a solidification rate of 0.5 is substantially equal to the Rh concentration at a position with a solidification rate of 0.9.

Next, characteristics of nine gallium oxide wafers (samples A to I) in the present Example are shown in Table 6. In Table 6, "Doping amount" indicates an Sn doping amount. Then, "UID" indicates that it is not intentionally doped with Sn. In addition, "Solidification rate" indicates a solidification rate of a portion of the gallium oxide single crystal (ingot) from which the wafer was cut out.

TABLE 6

| Sample | Doping amount [mol %] | Solidification rate | Sn concentration [ppm] | Carrier concentration [/cm³] | Mobility [cm²/V · s] |
|---|---|---|---|---|---|
| A | 0.1 | 0.1 | — | $3.6 \times 10^{18}$ | 60 |
| B | 0.1 | 0.6 | 73 | $1.5 \times 10^{18}$ | 77 |
| C | 0.05 | 0.25 | 14 | $5.0 \times 10^{17}$ | 107 |
| D | 0.2 | 0.01 | 66 | — | — |
| E | 0.2 | 0.10 | 22 | — | — |
| F | 0.2 | 0.70 | 23 | $7.3 \times 10^{17}$ | 84 |
| G | 0.2 | 0.95 | 7.0 | — | — |
| H | UID | 0.50 | 0.2 | — | — |
| I | UID | 0.87 | 0.5 | — | — |

Next, characteristics of four gallium oxide single crystals (samples J to M) in the present Example are shown in Table 7. In Table 7, "UID" indicates that it is not intentionally doped with Si and Sn.

TABLE 7

| Sample | Dopant | Carrier concentration [/cm³] | Mobility [cm²/V · s] | Specific resistance [Ω · m] | Measurement temperature [° C.] |
|---|---|---|---|---|---|
| J | UID | $3.1 \times 10^{8}$ | 33 | $8.8 \times 10^{8}$ | 25 |
| K | Si | $3.0 \times 10^{18}$ | 80 | $2.6 \times 10^{-2}$ | 25 |
| L | Sn | $2.2 \times 10^{18}$ | 72 | $3.9 \times 10^{-2}$ | 25 |
| M | Sn | $2.8 \times 10^{18}$ | 34 | $6.6 \times 10^{-2}$ | 400 |

According to Tables 6 and 7, the carrier concentration is not less than $3 \times 10^{18}$ cm$^{-3}$ in the sample A and the sample K. That is, in crystal growth using the manufacturing devices 1, 2 in the embodiment of the invention, it is possible to grow a gallium oxide single crystal with an n-type carrier concentration of not less than $3 \times 10^{18}$ cm³, and a wafer cut out of it.

Although the embodiment and Example of the invention have been described, the invention is not limited to the embodiment and Example, and the various kinds of modifications can be implemented without departing from the gist of the invention.

In addition, the embodiment and Example described above do not limit the invention according to claims. Further, please note that all combinations of the features described in the embodiment and Example are not necessary to solve the problem of the invention.

REFERENCE SIGNS LIST 1, 2 MANUFACTURING DEVICE
10 FURNACE CORE TUBE
11 FURNACE INNER TUBE
14 PLATE-SHAPED MEMBER
15 HEAT-RETENTION MATERIAL
20 CRUCIBLE
21 CRUCIBLE SUPPORT
22 CRUCIBLE SUPPORT SHAFT
23 HEATING ELEMENT
231 HEAT-GENERATING PORTION

The invention claimed is:

1. A gallium oxide crystal manufacturing device, comprising:
a crucible to hold a gallium oxide source material therein;
a crucible support that supports the crucible from below;
a crucible support shaft that is connected to the crucible support from below and vertically movably supports the crucible and the crucible support;
a tubular furnace core tube that surrounds the crucible, the crucible support and the crucible support shaft;
a tubular furnace inner tube that surrounds the furnace core tube; and
a resistive heating element comprising a heat-generating portion placed in a space between the furnace core tube and the furnace inner tube,
wherein melting points of the furnace core tube and the furnace inner tube are not less than 1900° C.,
wherein a thermal conductivity of a portion of the furnace core tube located directly next to the crucible in a radial direction of the furnace core tube is higher than a thermal conductivity of the furnace inner tube, and
wherein the furnace core tube comprises a first portion including the portion located directly next to the crucible in the radial direction of the furnace core tube and a second portion other than the first portion, and a thermal conductivity of the first portion is higher than a thermal conductivity of the second portion.

2. The gallium oxide crystal manufacturing device according to claim 1, comprising:
a plate-shaped member that covers an opening at an upper end of the furnace core tube; and
a heat-retention material placed on the plate-shaped member.

3. The gallium oxide crystal manufacturing device according to claim 1, wherein the portion of the furnace core tube located directly next to the crucible in the radial direction of the furnace core tube comprises an alumina-based ceramic or a magnesia-based ceramic, and the furnace inner tube comprises a zirconia-based ceramic.

4. The gallium oxide crystal manufacturing device according to claim 1, wherein the crucible comprises a platinum-based alloy.

5. The gallium oxide crystal manufacturing device according to claim 4, wherein the crucible support comprises a first block as the uppermost portion comprising a zirconia-based ceramic and directly in contact with the crucible, and a second block located under the first block, comprising an alumina-based ceramic and not in contact with the crucible.

6. The gallium oxide crystal manufacturing device according to claim 1, wherein the furnace inner tube is surrounded by a heat-retention layer from side, above and below, the heat-retention layer is vertically separated into two sections, an upper heat-retention layer covering the upper side of the furnace inner tube and a lower heat-retention layer covering the lateral and lower sides of the furnace inner tube, the upper heat-retention layer and the lower heat-retention layer vertically sandwich a gap, and the gap is provided so as not to be horizontally continuous from the inside to the outside of the heat-retention layer.

* * * * *